United States Patent
Jedema et al.

(10) Patent No.: US 8,344,349 B2
(45) Date of Patent: Jan. 1, 2013

(54) ELECTRONIC COMPONENT, AND A METHOD OF MANUFACTURING AN ELECTRONIC COMPONENT

(75) Inventors: Friso Jacobus Jedema, Eindhoven (NL); Michael Antoine Armand in't Zandt, Veldhoven (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 263 days.

(21) Appl. No.: 12/676,393

(22) PCT Filed: Aug. 29, 2008

(86) PCT No.: PCT/IB2008/053498
§ 371 (c)(1),
(2), (4) Date: May 5, 2010

(87) PCT Pub. No.: WO2009/031086
PCT Pub. Date: Mar. 12, 2009

(65) Prior Publication Data
US 2011/0031462 A1    Feb. 10, 2011

(30) Foreign Application Priority Data
Sep. 7, 2007 (EP) .................................. 07115899

(51) Int. Cl.
*H01L 47/00* (2006.01)
(52) U.S. Cl. ........... 257/4; 257/2; 257/42; 257/E45.002; 257/E21.003; 257/E21.068; 438/84; 438/102; 438/53
(58) Field of Classification Search ............ 257/4, 2, 257/42, E45.002, E21.003, E21.068; 438/84, 438/102, 53
See application file for complete search history.

(56) References Cited

U.S. PATENT DOCUMENTS

| | | |
|---|---|---|
| 2001/0049189 A1 | 12/2001 | Zahorik |
| 2003/0003709 A1 | 1/2003 | Xu |
| 2003/0075778 A1 | 4/2003 | Klersy |
| 2003/0222292 A1 | 12/2003 | Joo et al. |
| 2005/0263829 A1 | 12/2005 | Song et al. |
| 2007/0096248 A1* | 5/2007 | Philipp et al. ................. 257/528 |
| 2007/0121363 A1 | 5/2007 | Lung |
| 2007/0194294 A1 | 8/2007 | Song et al. |

FOREIGN PATENT DOCUMENTS

| | | |
|---|---|---|
| EP | 1 717 861 A | 11/2006 |
| EP | 1 780 814 A | 5/2007 |
| JP | 2005-340837 | 12/2005 |
| JP | 2008-130804 | 6/2008 |

OTHER PUBLICATIONS

International Searching Authority—European Patent Office, Authorized Officer Hans Meul, PCT International Search Report, International Application No. PCT/IB2008/053498, 3 pages, HV Rijswijk, Mailed Feb. 5, 2009.
Japanese language office action dated Aug. 28, 2012.
English language translation of office action. (Aug. 28, 2012).
English language translation of abstract of JP 2005-340837 (published Dec. 8, 2008).
English language translation of abstract of JP 2008-130804 (published Jun. 5, 2008).

* cited by examiner

*Primary Examiner* — Tu-Tu Ho
(74) *Attorney, Agent, or Firm* — McClure, Qualey & Rodack, LLP

(57) ABSTRACT

Provided is an electronic component that includes a first bi-layer stack including a first silicon oxide layer and a first silicon nitride layer, a second bi-layer stack including a second silicon oxide layer and a second silicon nitride layer, and a convertible structure which is convertible between at least two states having different electrical properties, where the convertible structure is arranged between the first bi-layer stack and the second bi-layer stack.

17 Claims, 5 Drawing Sheets

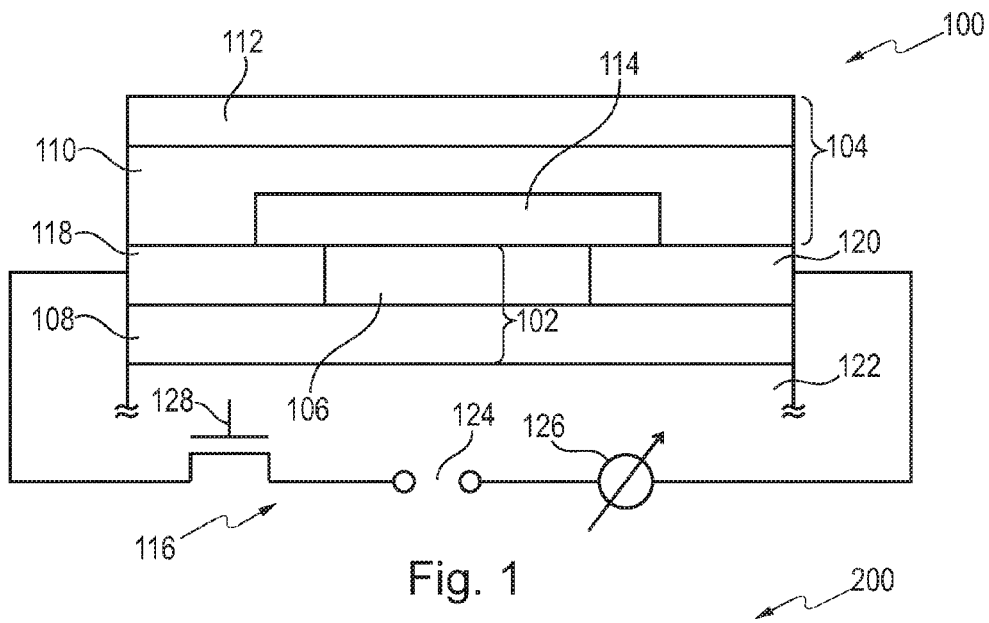
Fig. 1
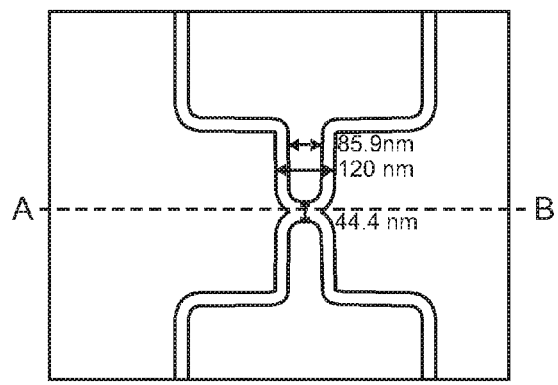
Fig. 2
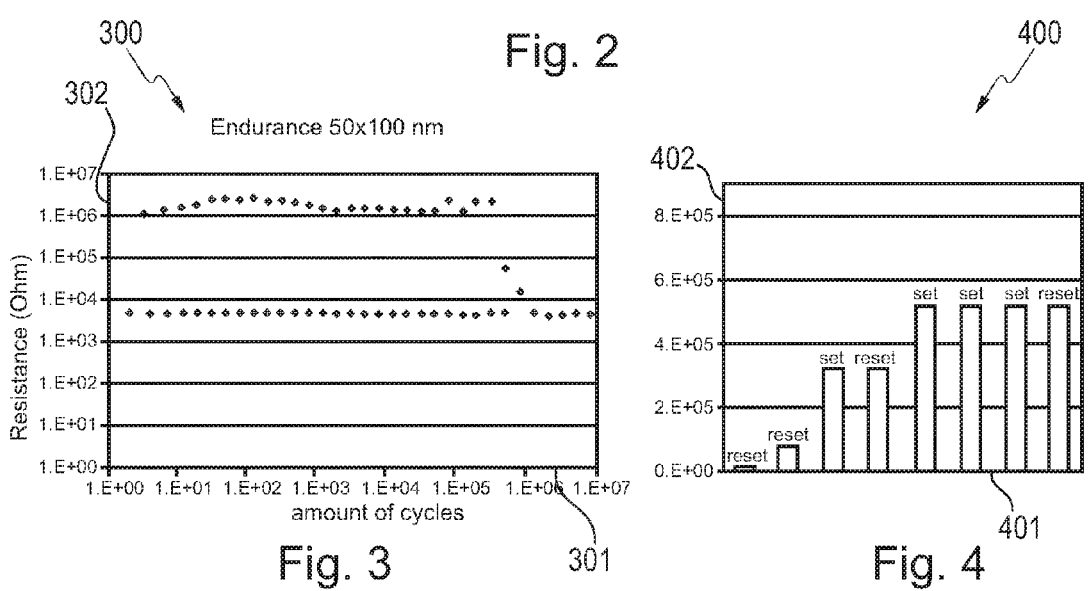
Fig. 3
Fig. 4

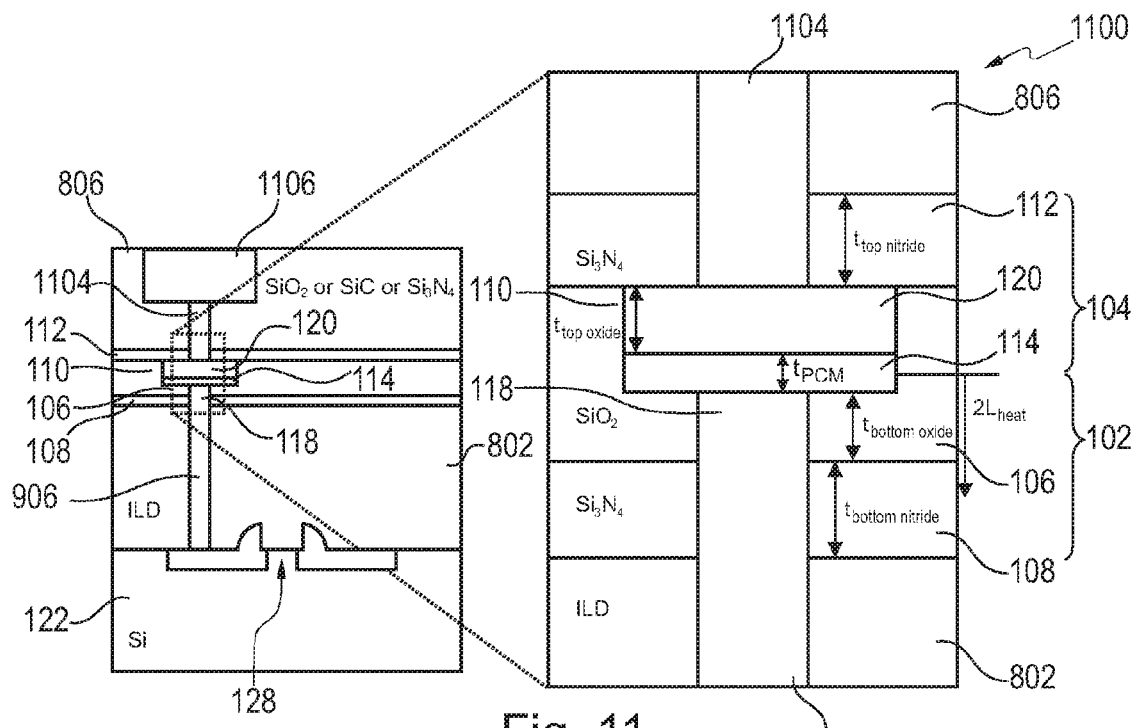
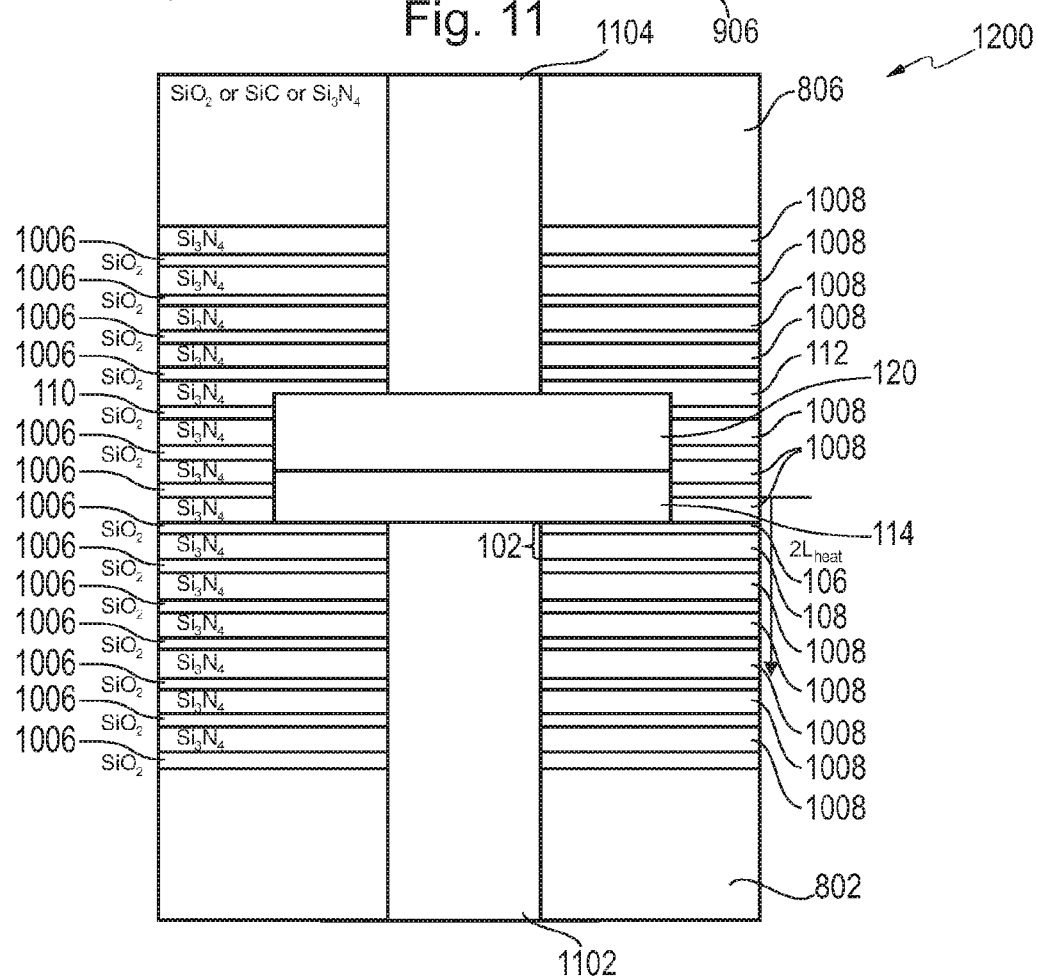

ELECTRONIC COMPONENT, AND A METHOD OF MANUFACTURING AN ELECTRONIC COMPONENT

CROSS REFERENCE

This application is a United States national phase of co-pending international patent application No. PCT/IB2008/053498, filed Aug. 29, 2008, which claims priority to European patent application number 07115899.2, filed Sep. 7, 2007, the disclosures of which are incorporated herein by reference.

TECHNICAL FIELD

The invention relates to an electronic component.

Moreover, the invention relates to a method of manufacturing an electronic component.

BACKGROUND

In the field of non-volatile memories, flash memory scaling to lower dimensions has become a real issue. Technologies to face this challenge are ferroelectric, magnetic and phase change memories, the latter one being promising for the replacement of flash and showing characteristics that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes which are slightly different compositions, based on their crystallization mechanism. The "nucleation dominated" material $GeTe-Sb_2Te_3$ tie line such as $Ge_2Sb_2Te_5$ are generally used in ovonic unified memory (OUM) devices. In this concept, the phase change material may be in contact with a bottom-resistive electrode to switch reversibly to a small volume of phase change material. "Fast growth material", known in optical storage application (CD-RW/DVD+RW), enable very fast switching (for instance 10 ns) with a proper phase stability.

Thus, phase change materials may be used to store information. The operational principle of these materials is a change of phase. In a crystalline phase, the material structure, and thus, properties, are different from the properties in the amorphous phase.

US 2003/0075778 A1 discloses a programmable resistance memory element. The active volume of memory material is made small by the presence of a small area of contact between the conductive material and the memory material. Forming a region of conductive material and an intersecting sidewall layer of the memory material creates the area of contact. The region of conductive material is preferably a sidewall layer of conductive material.

The endurance of a phase change memory cell may be denoted as the number of cycles a cell can be switched between a low resistance value (SET state) and a high resistance value (RESET state). However, the endurance of conventional phase change memory cells may be too small.

OBJECT AND SUMMARY

It is an object of the present disclosure to provide various embodiments of an electronic component having a convertible structure, which has a sufficiently high endurance.

In order to achieve the object defined above, an electronic component and a method of manufacturing an electronic component according to the independent claims are provided.

According to an exemplary embodiment of the invention, an electronic component is provided, the electronic component comprising a first bi-layer stack comprising a first silicon oxide layer and a first silicon nitride layer a second bi-layer stack comprising a second silicon oxide layer and a second silicon nitride layer and a convertible structure which is convertible between at least two states having different electrical properties, wherein the convertible structure is at least partially arranged between the first bi-layer stack and the second bi-layer stack.

According to another exemplary embodiment of the invention, a method of forming an electronic component is provided, the method comprising forming a first bi-layer stack comprising a first silicon oxide layer and a first silicon nitride layer, forming a second bi-layer stack comprising a second silicon oxide layer and a second silicon nitride layer, and arranging a convertible structure, which is convertible between at least two states having different electrical properties, between the first bi-layer stack and the second bi-layer stack.

The term "electronic component" may particularly denote any component, member or apparatus, which fulfils any electric, magnetic and/or electronic functionality. This means that electric, magnetic and/or electromagnetic signals may be applied to and/or generated by the electronic device during regular use.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure which has the property to change any physical parameter or material property under the influence of heat (generated by ohmic losses (Joule heating or resistive dissipation) of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated in a substrate such as a silicon substrate) which allows to store information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate that may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "bi-layer stack" may particularly denote a stack or layer sequence comprising or consisting of two layers provided above one another or lateral adjacent to one another, namely a silicon oxide layer ($SiO_2$) and a silicon nitride layer ($Si_3N_4$).

According to an exemplary embodiment of the invention, a convertible structure such as a layer of phase change material is covered for instance on its bottom by a first bi-layer stack consisting of silicon oxide and silicon nitride, and is covered for instance on its top by a second bi-layer stack consisting of a silicon oxide and a silicon nitride layer so that the convertible structure may be vertically and/or horizontally surrounded by the described bi-layer stacks, particularly in direct contact with silicon oxide material. By taking this measure, namely by providing two bi-layer stacks of the described dielectric materials enclosing at least partially the convertible structure, it has surprisingly turned out experimentally that the number of switching cycles of a phase change line cell can be enhanced by a factor of hundred or more.

Particularly, according to an exemplary embodiment of the invention, a phase change memory device may be provided comprising a layer stack of a first bi-layer stack consisting of a first silicon nitride layer and a first silicon oxide layer, a second bi-layer stack consisting of a second silicon nitride layer and a second silicon oxide layer, and a phase change material layer situated in between the first bi-layer stack and the second bi-layer stack such that the phase change material layer is at least partly contacted to the first silicon oxide layer and the second silicon oxide layer. Particularly, when the thickness of the silicon nitride layers is in the order of magnitude of 50 nm each, an increase of the endurance may be obtained. It is also possible that a number of further bi-layer stacks is provided each consisting of a further silicon nitride layer and a further silicon oxide layer, the one or more further bi-layer stacks being arrangeable around the first and second bi-layer stacks to constitute a sandwich structure of alternating silicon oxide/silicon nitride layers.

Since the bi-layer stacks may be made of dielectric material, which is electrically non-conducting, passing an electric current through the bi-layer stacks during programming or reading of such an electronic component is prevented. For a line cell as well as for an OUM cell, the silicon nitride/silicon oxide bi-layer partly, essentially completely or entirely surrounds a phase change material.

Next, further exemplary embodiments of the electronic component will be explained. However, these embodiments also apply to the method of manufacturing an electronic component.

The convertible structure may be at least partially contacted to the first silicon oxide layer and/or to the second silicon oxide layer. In other words, there may be a direct contact between the silicon oxide material and the convertible structure promoting an enhancement of the endurance. Particularly, a bottom surface of the convertible layer may be in contact with the first silicon oxide layer, and a top surface of a convertible layer may be in direct contact with the second silicon oxide layer. Thus, the convertible structure may be partly or essentially entirely (particularly only with the exception of electrode contacts) be enclosed by silicon oxide material, which has turned out to have a proper impact on the endurance characteristics, in particular in combination with outer silicon nitride structures.

The electronic component may comprise at least one further bi-layer stack each comprising a further silicon oxide layer and a further silicon nitride layer. At least one of the group consisting of the first bi-layer stack and the second bi-layer stack may be arranged between the convertible structure and at least one of the at least one further bi-layer stack. Thus, a layer sequence of three or more bi-layer stacks may be provided which may surround the phase change material in vertical and/or horizontal directions. Such an architecture may further increase the endurance.

At least one of the group consisting of the first silicon oxide layer, the first silicon nitride layer, the second silicon oxide layer and the second silicon nitride layer may be made by Plasma-Enhanced Chemical Vapour Deposition (PECVD). Particularly, it has turned out that a PECVD $SiO_2$ or a PECVD $Si_3N_4$ is particularly advantageous for the two bi-layer stacks above and below the phase change material. The first silicon nitride layer and/or the second silicon nitride layer may have a thickness between essentially 10 nm and essentially 200 nm, particularly may have a thickness between essentially 20 nm and essentially 100 nm. For example, it has turned out to be highly advantageous when the thickness of the silicon nitride layer is in the order of magnitude of around 50 nm to obtain the desired increase in the endurance. Particularly in combination with these thicknesses of the silicon nitride layers, the first silicon oxide layer and/or the second silicon oxide layer may have a thickness between essentially 5 nm and essentially 100 nm, particularly may have a thickness between essentially 10 nm and essentially 50 nm. Particularly, the silicon oxide layer may have a thickness of 20 to 30 nm. In general, it is believed to be advantageous that the silicon oxide layers have a smaller thickness than the silicon nitride layers.

In one embodiment, the first silicon oxide layer and the second silicon oxide layer are formed as separate layers. In another embodiment, the first silicon oxide layer and the second silicon oxide layer are integrally formed as a common layer, different portions of the common layer contacting different surface portions of the convertible structure. However, in most embodiments, the first silicon nitride layer and the second silicon nitride layer are formed as separate layers. In most embodiments, the silicon oxide layer(s) directly contact(s) the convertible structure, whereas the silicon nitride layer(s) directly contact(s) the silicon oxide layer(s), but do not necessarily contact the convertible structure in such an embodiment.

The phase change structure may be adapted such that a value of the electrical conductivity of the phase change material differs between at least two (2) phase states. In one of the at least two phase states, the phase change structure may be electrically conductive. In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic device will be influenced, will be defined or will depend on the present value of the electrical conductivity of the phase change material in the phase change structure. This may allow manufacturing memory cells, switches, actuators, sensors, etc. using the different value of the electrical conductivity of the phase change structure in the different phase modes.

The phase change structure may be adapted such that one of the two phase states relates to a crystalline phase and the other one of the two phase states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, GeInSbTe, InSe, SbSe, SbTe, InSbSe, InSbTe, GeSbSe, GeSbTeSe or AgInSbSeTe.

The different electrical properties in the at least two different states may be different values of the electrical conductivity, different values of the permittivity, different values of the magnetic permeability, different values of the capacitance, or different values of the inductance of the convertible structure. Thus, the phase change may influence any electrical property that can be sampled, for instance may change the electrical permittivity of a dielectric, which electrical permittivity of a dielectric may change a value of a capacitance of a capacitor, which may be sampled by applying a test voltage. Or, the phase change may change the magnetic permeability and consequently the inductance of an inductor, which may as well be sampled in an electronic manner.

The electronic component may comprise an electric driving and sensing circuitry adapted for driving sensing the different electrical properties of the convertible structure in different ones of the at least two states. For instance, a test voltage may be applied to the convertible structure, and a current flowing along the convertible structure will depend on the phase state of the convertible structure, since the electrical conductivity is different in the crystalline and in the amorphous phase. Such a sensing circuitry may also include selection transistors or other kinds of switches, which selectively enable or disable access to a particular electronic component of an array of electronic components. Thus, a respective selection transistor may be assigned to each one of the electronic components.

The convertible structure may be electrically conductive in at least one of the at least two states. Therefore, a sampling current may flow along the convertible structure and may be sensed or detected so that, for instance in the context of a memory cell, it may be determined whether a logical state "1" or a logical state "0" is presently stored in the respective memory cell. Thus, different logical values may be encoded in different values of the electrical conductivity.

The electronic component may comprise a first electrode (or electric terminal) and a second electrode (or electric terminal), wherein the convertible structure may connect or bridge the first electrode with the second electrode. Therefore, between the first and second electrode, a heating current for heating the convertible structure (for instance for triggering a phase change) may be applied, and also a sampling current for detecting the present state of the convertible structure may be applied via the electrodes. For heating, it is also possible to use a separate element such as a heater which is thermally coupled to the convertible structure and which may efficiently transfer heat (for instance Joule heat) to the convertible structure. Alternatively, electromagnetic radiation may be used for heating the convertible structure.

An arrangement of the first electrode, the convertible structure, and the second electrode may be aligned (for instance horizontally and therefore) essentially perpendicular to an (for instance vertical) arrangement of the first bi-layer stack, the convertible structure, and the second bi-layer stack. Thus, in a sequence of layers having surface dimensions which are significantly larger than a thickness, a contact area between the electrodes and the phase change material may be significantly smaller than a contact area between the bi-layer stacks and the phase change material, thereby ensuring an increase of the endurance. Alternatively, an arrangement of the first electrode, the convertible structure, and the second electrode may be aligned or may be essentially parallel to an (for instance vertical) arrangement of the first bi-layer stack, the convertible structure, and the second bi-layer stack.

The electronic component may comprise a switch, particularly a field effect transistor or a diode, electrically coupled to the phase change structure. In such a configuration, the field effect transistor may serve as a switch to allow an access to the phase change structure, or to prevent such an access. Such a configuration may be appropriate for a memory array comprising a plurality of memory cells, allowing to control each individual one of the memory cells using such a select transistor.

The electronic device may be adapted as a memory device. In such a memory device, the information of one or more bits may be stored in the present phase of the phase change material, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a X-Y matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the convertible structure may result in a specific motion of a movable component of the microelectromechanical structure (MEMS).

For any method step, any conventional procedure as known from semiconductor technology may be implemented. Forming layers or components may include deposition techniques such as CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures, polysilicon structures or phase change structures. For semiconductor regions or components, crystalline silicon may be used. For insulating portions, silicon oxide, silicon nitride or silicon carbide may be used.

The structure may be formed on a purely crystalline silicon wafer or on an SOI wafer (Silicon On Insulator).

Any process technologies like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 1 illustrates an electronic component according to an exemplary embodiment of the invention.

FIG. 2 shows a scanning electron microscope top view image of a 50-100 nm PCRAM line cell.

FIG. 3 shows a diagram illustrating endurance measurements of phase change memory cells.

FIG. 4 shows a diagram illustrating endurance values of a set of 8 line cells.

FIG. 11 shows an overview and a detailed cross-section of an electronic component according to an exemplary embodiment of the invention.

FIG. 12 illustrates a cross-sectional view of a layer sequence of an electronic component according to an exemplary embodiment of the invention.

DESCRIPTION OF EMBODIMENTS

Figure 5:
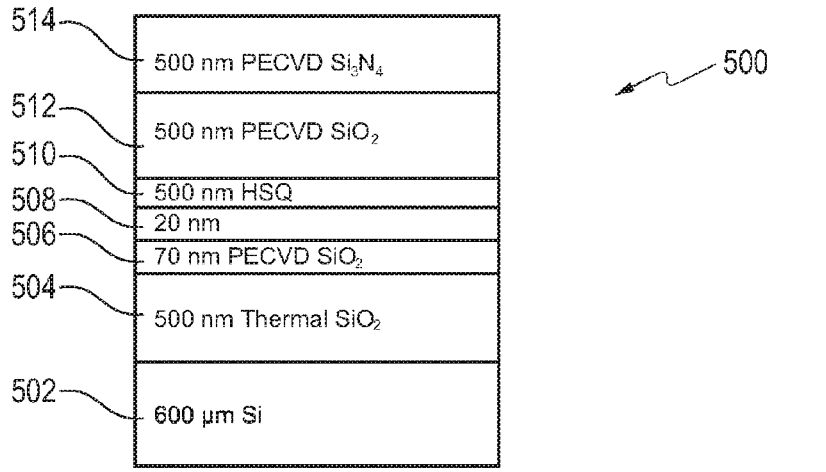
FIG. 5 shows a cross-section of a conventional layer stack of a PCRAM line cell along a line A-B indicated in FIG. 2.

The illustration in the drawing is schematical. In different drawings, similar or identical elements are provided with the same reference signs.

In the following, referring to FIG. 1, an electronic component 100 according to an exemplary embodiment of the invention will be explained.

The electronic component 100 is formed as a layer sequence on a silicon substrate 122.

A first bi-layer stack 102 is provided comprising a first silicon oxide layer 106 and a first silicon nitride layer 108. A second bi-layer stack 104 is provided comprising a second silicon oxide layer 110 and a second silicon nitride layer 112. A phase change material structure 114 which is convertible between at least two states having different electrical conductivities is shown and arranged between the two bi-layer stacks 102, 104.

The first silicon nitride layer 108 is formed on the silicon substrate 122. Above the first silicon nitride layer 108, a horizontal alignment of a first electrode 118, the first silicon oxide layer 106 and a second electrode 120 is provided. Above this horizontal structure arrangement, a phase change material structure 114 is formed contacting both electrodes 118, 120 and the silicon oxide layer 106. Above the phase change material structure 114, the second silicon oxide layer 110 is formed, and above the second silicon oxide layer 110, the second silicon nitride layer 112 is formed.

Thus, the phase change material 114 is essentially completely embedded in silicon oxide material formed by the layers 106 and 110, apart from a small contacting area for an electrical contact with the electrodes 118, 120. In turn, the silicon oxide layers 106, 110 are contacted by silicon nitride material 108, 112. The dielectric layers 106, 108, 110 and 112 are formed by Plasma-Enhanced Chemical Vapour Deposition (PECVD).

Beyond this, an electric driving and sensing circuitry 116 is provided which is adapted for driving and sensing the different electrical conductivities of the phase change material structure 114 in different ones of the at least two states (for instance crystalline, amorphous). Particularly, the electric driving and sensing circuitry 116 comprises a switch transistor 128, a voltage source 124 and an amperemeter 126 for current detection. When the gate of the switch transistor 122 is conductive by applying a corresponding gate voltage, a voltage generated by the voltage source 124 can be applied between the electrodes 118, 120. Depending on the present resistance or electrical conductivity of the phase change material structure 114, a current measured by the amperemeter 126 has a higher or a lower value. This may allow to sample a present state of the phase change material 114, thereby allowing to read out stored information. For programming information in the phase change material structure 114, a larger current can be applied via the voltage source 124 to the phase change material structure 114, to bring the latter in the SET or RESET state.

In the following, some background information will be given based on which exemplary embodiments of the invention have been developed.

Phase change random access memory (PCRAM) is a possible competitor to replace non-volatile flash memory technology. PCRAM technology has several advantages compared to flash technology in terms of programming speed, scalability, cell size and number of lithographic masks. Ultimately, it offers a better performing non-volatile memory at a lower cost. Particularly two concepts of PCRAM cells are used, namely an Ovonics Universal Memory (OUM) concept, and a lateral line cell concept.

FIG. 2 shows an image 200 of a 50 nm wide and 100 nm long line cell.

FIG. 2 is a scanning electron microscope top view image 200 of a 50 to 100 nm designed PCRAM line cell, wherein a cross-section of the layer stack according to a line A-B in FIG. 2 is shown in FIG. 5 which will be explained below.

Single line cell measurements with a standard layer stack show that a considerable fraction of line cells do not achieve $10^5$ cycles, as can be taken from FIG. 3 and FIG. 4.

FIG. 3 shows a diagram 300 having an abscissa 301 along which an amount of cycles is plotted and having an ordinate 302 along which the resistance is plotted in Ohm. FIG. 3 illustrates endurance measurements on 50 mn wide and 100 nm long line cells, using a standard layer stack. FIG. 3 shows the cycling as a function of cycling number. After $3 \times 10^5$ cycles, the PCRAM line cell remains in the low resistance set state and cannot be programmed into the high resistive reset state any more.

FIG. 4 shows a diagram 400 having an abscissa 401 along which different line cells of a set are plotted, and has an ordinate 402 along which a number of cycles is plotted each cell could reach. Thus, each bar in FIG. 4 represents one line cell.

Therefore, FIG. 4 illustrates the problem with a limitation of the endurance of conventional line cells, showing the measured endurance for a set of 8 line cells of 50 nm width and 100 nm length. From this set of 8 line cells, two cells have an endurance less than the required $10^5$ cycles. The minimal endurance of the set of 8 lines was only $1.1 \times 10^4$ cycles. FIG. 3 shows an endurance plot for one of 8 cells, yielding an average endurance for a set of 8 line cells of $3 \times 10^5$ cycles.

FIG. 5 shows a conventional electronic component 500 comprising a silicon substrate 502, a first silicon oxide layer 504 formed on the silicon substrate 502, a second silicon oxide layer 506 formed on the first silicon oxide layer 504, a phase change material layer 508 formed on the second silicon oxide layer 506, a Hydrogen Silses Quioxane (HSQ) layer 510 formed on the phase change material layer 508, a third silicon oxide layer 512 formed on the HSQ layer 510, and a silicon nitride layer 514 formed on the third silicon oxide layer 512.

In FIG. 5, the standard layer stack 500 of the 50-100 nm PCRAM line cell is shown. The lines are patterned by electron beam lithography, using the HSQ layer 510 on top of the phase change layer 508 as a hard mask for etching. In a practical manufacturing process, the HSQ 510 will be omitted.

In the following, a solution according to an exemplary embodiment of the invention of the problem described above referring to FIG. 2 to FIG. 5 of a limited endurance of phase change material memory cells will be given.

It is experimentally observed that the endurance of line cells can be improved by a factor of hundred or more by changing the layer stack of the PCRAM line cell.

Figures 6, 7:
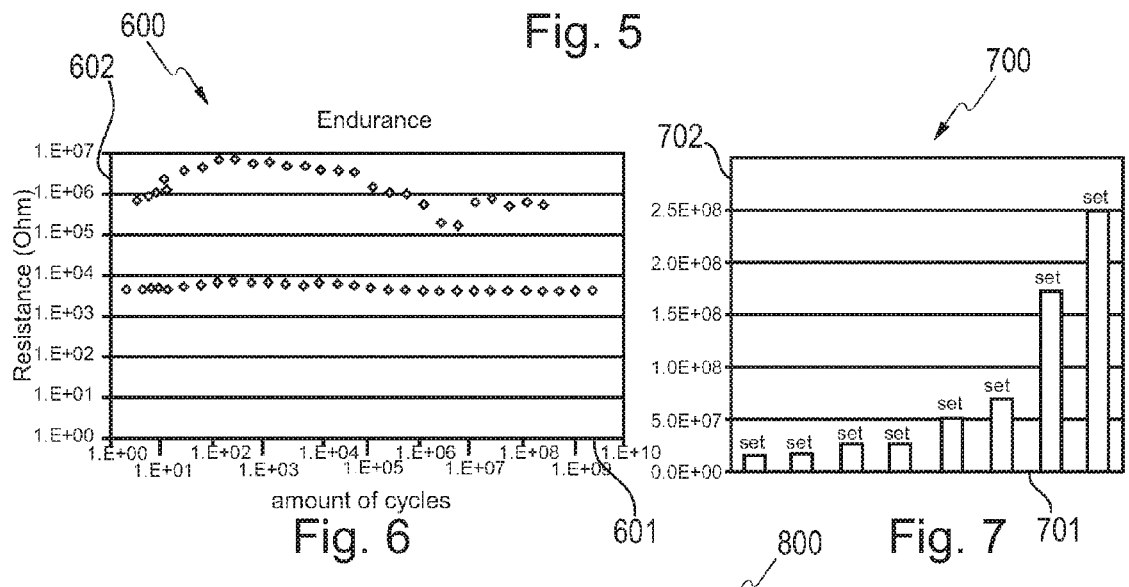
FIG. 6 shows a diagram illustrating endurance measurements of phase change memory cells according to an exemplary embodiment of the invention.
FIG. 7 shows a diagram illustrating endurance values of a set of 8 line cells according to an exemplary embodiment of the invention.

FIG. 6 shows a diagram 600 illustrating the endurance characteristics according to an exemplary embodiment of the invention.

Along an abscissa 601 of the diagram 600, a number of pulses are plotted. Along an ordinate 602, the resistance is plotted in Ohm.

FIG. 7 shows a diagram 700 having an abscissa 701 along which cells of a set are plotted, and comprises an ordinate 702 along which a number of cycles of a corresponding one of the cells is plotted.

FIG. 6 shows endurance measurements on 50 nm wide and 100 nm long line cells, using a silicon oxide/silicon nitride bi-layer stack. FIG. 6 shows the cycling as a function of cycle number. After $2.5 \times 10^8$ cycles, the PCRAM line cell remains in the low resistive set state and cannot be programmed into the high resistive reset state anymore. FIG. 7 shows the endurance value of the set of 8 line cells of a size 50-100 nm. Each bar in FIG. 7 represents one line cell, and the vertical axis 702 represents a number of cycles each line cell can be cycled.

Thus, FIG. 6 and FIG. 7 show the endurance of a set of 8 line cells of 50 nm wide and 100 nm long phase change material memory cells with a layer stack according to an exemplary embodiment of the invention, having silicon oxide/silicon nitride bi-layer stacks. The average endurance of the set of 8 line cells with the silicon oxide/silicon nitride bi-layer stack of FIG. 7 is $7.9 \times 10^7$ cycles. The number is more than a factor hundred larger as compared to the average endurance of $3 \times 10^5$ cycles of the set of 8 line cells with the standard stack as shown in FIG. 4. Even more important is the fact that the minimal endurance in this set of 8 sample is $1.5 \times 10^7$ cycles, about hundred times larger than the required minimum $1 \times 10^5$ cycles as set by flash technology. Comparing the minimal endurance value of $1.5 \times 10^7$ cycles to the minimal endurance value of $1.1 \times 10^4$ cycles of the set of 8 lines having the standard layer stack, the improvement is even a factor thousand.

Figure 8:
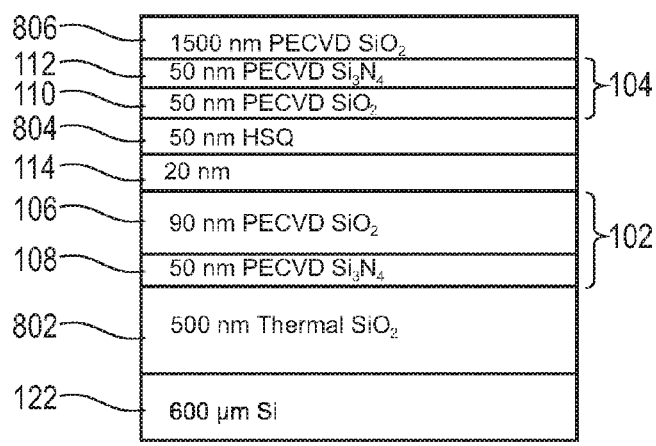
FIG. 8 shows a cross-section of a layer stack of a PCRAM line cell along a line A-B indicated in FIG. 2 according to an exemplary embodiment of the invention.

FIG. 8 shows a layer sequence 800 of an electronic component according to an exemplary embodiment of the invention.

More particularly, FIG. 8 shows a cross-section of a silicon oxide/silicon nitride bi-layer stack of a 50-100 nm PCRAM line cell. The stack shows a cross-section which corresponds to a line A-B, as indicated in FIG. 2.

As compared to the layer sequence shown in FIG. 1, the layer sequence 800 further comprises an additional silicon oxide layer 802 manufactured by thermally oxidizing the silicon substrate 122, and comprises a 50 nm HSQ layer 804 (which can be omitted in a practical realization) between the phase change material layer 114 and the first silicon oxide layer 110. Moreover, a thick PECVD silicon oxide layer 806 is provided on top of the layer sequence 800.

The main difference between the standard stack of FIG. 5 and the silicon oxide/silicon nitride bi-layer stack 800 of FIG. 8 is mainly the insertion of two silicon nitride layers 108, 112, each having a thickness of approximately 50 nm.

The reason why the silicon oxide/silicon nitride bi-layer stack 800 gives a much better endurance is not fully understood at this moment. Without wishing to be bound to a specific theory, it is presently believed that the reasons can be mechanical as well as chemical in origin or a combination of both. However, for both mechanisms, the temperature profile during cycling may be likely to be an important factor. Therefore, it is believed that the heat penetration length is an important length scale for both mechanisms. This means that at distances further away than approximately twice the heat penetration length, as measured from the center position of the line, the influence of the surrounding dielectric materials is probably not noticeable anymore. For silicon oxide and silicon nitride, the heat penetration length ($L_{heat}$) associated with the applied 50 ns electrical programming pulses is about 100 nm. The heat penetration length may be defined:

$$L_{heat} = (D \times \Delta t_{pulse})^{1/2}$$

where $D=\lambda/C$ is the thermal diffusion constant of the dielectric material, $\lambda$ is the heat conductivity [W/mK] of the dielectric material, $C$ [J/m$^3$] is the heat capacity of the dielectric material and $\Delta t_{pulse}$ [s] is the duration of the electrical pulse.

Figure 9:
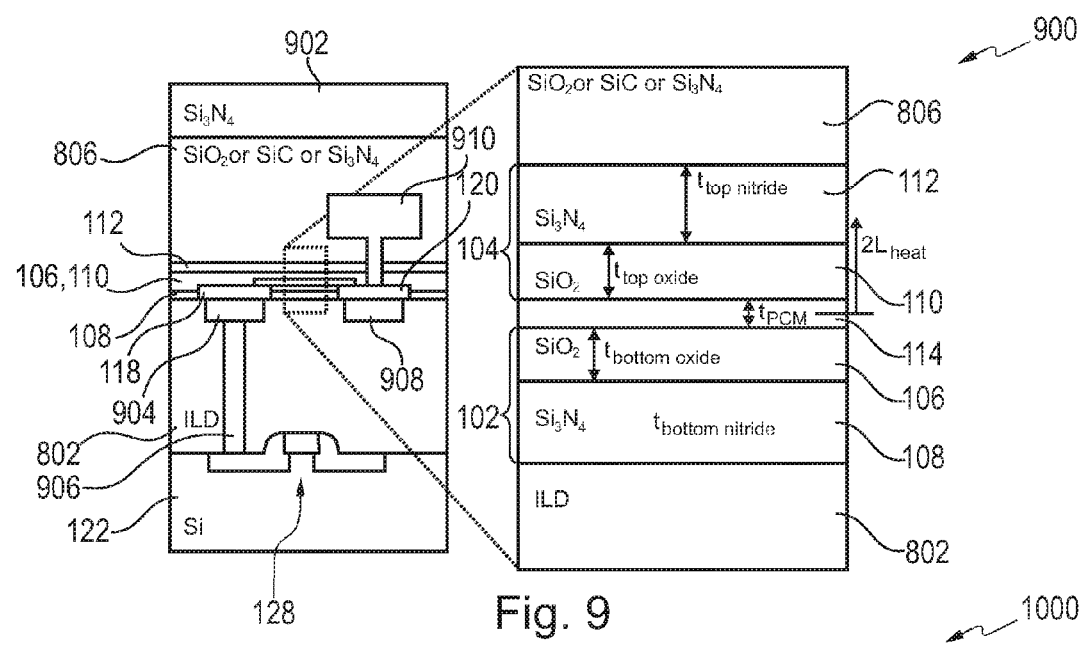
FIG. 9 shows an overview and a detailed cross-section of an electronic component according to an exemplary embodiment of the invention.

FIG. 9 shows a cross-sectional view of a memory cell 900 according to another exemplary embodiment of the invention.

In addition to the components described above, FIG. 9 has a further top silicon nitride layer 902. Layer 802 is configured as an ILD (inter layer dielectric). The first electrode 118 manufactured from tantalum nitride is contacted via a first metallization structure 904 and a tungsten via 906 to a front end transistor 128. The second electrode 120 is contacted via a second metallization structure 908 and via a third metallization structure 910.

Therefore, FIG. 9 shows a PCRAM line cell with a single silicon oxide/silicon nitride bi-layer stack 102, 104 above and below the phase change material 114. In order to obtain a proper endurance, the following constraints in FIG. 9 shall be considered:

$$t_{bottom\ nitride} + t_{bottom\ oxide} + t_{PCM} + t_{top\ oxide} + t_{top\ nitride} > 4 L_{heat}$$

both $t_{bottom\ oxide}$ and $t_{top\ oxide}$ < both $t_{bottom\ nitride}$ and $t_{top\ nitride}$.

Practically, this may result in silicon oxide layers of 5 nm to 100 nm thickness and silicon nitride layers of 10 nm to 200 nm thickness. Practically, the minimal thickness of the silicon oxide layers and the silicon nitride layers may be limited by manufacturing processes. However, by processes such as ALD (Atomic Layer Deposition), very small layer thicknesses can be manufactured.

Figure 10:
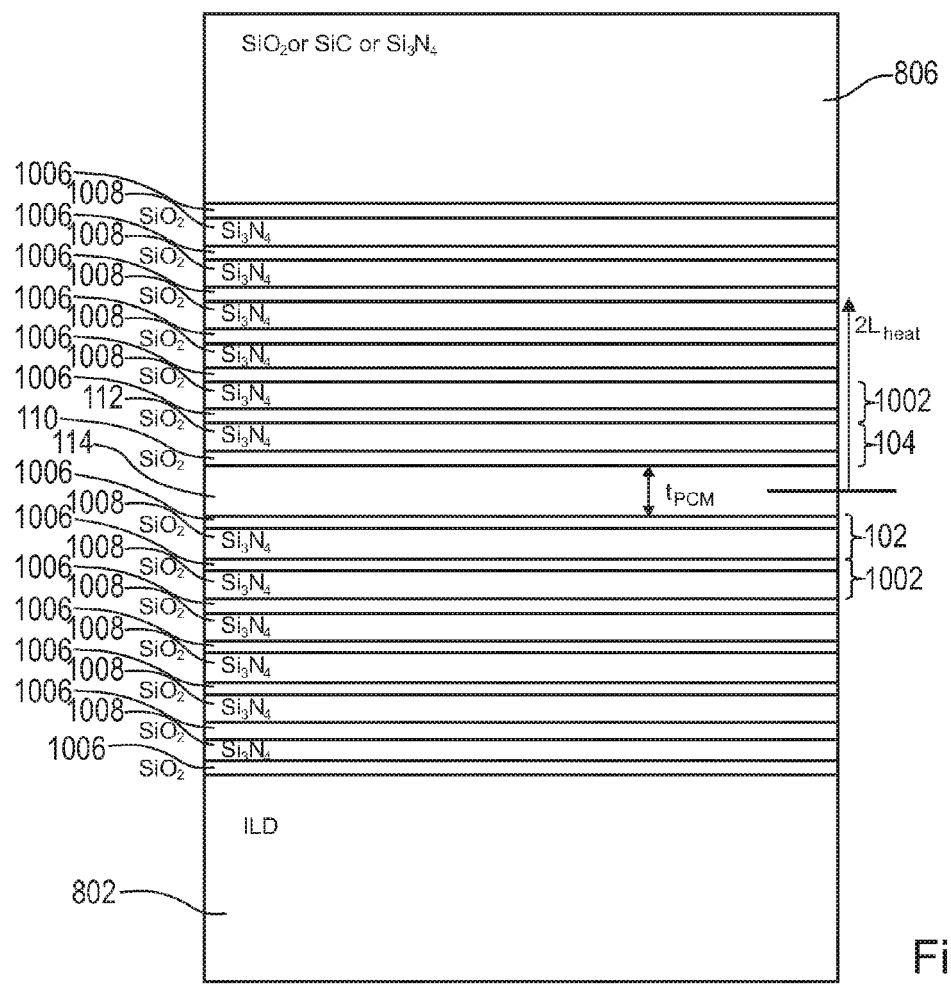
FIG. 10 illustrates a cross-section of a layer stack of an electronic component according to an exemplary embodiment of the invention.

In the following, referring to FIG. 10, a phase change memory cell 1000 according to another exemplary embodiment of the invention will be explained which has multiple silicon oxide/silicon nitride bi-layer stacks 102, 104, 1002.

The additional bi-layer stacks are denoted with reference numeral 1002 and are each formed by a silicon oxide layer 1006 and a silicon nitride layer 1008. For manufacturing the embodiment of FIG. 10, the following constraints shall be considered:

$$N \times (t_{bottom\ nitride} + t_{bottom\ oxide}) + N \times (t_{top\ oxide} + t_{top\ nitride}) + t_{PCM} > 4 L_{heat}$$

both $t_{bottom\ oxide}$ and $t_{top\ oxide}$ < both $t_{bottom\ nitride}$ and $t_{top\ nitride}$.

The multiplication number N (in FIG. 10, N=6) can become very large for very thin silicon oxide layers 106, 110, 1006 and for very thin silicon nitride layers 108, 112, 1008, for instance when $t_{oxide}$ and $t_{nitride}$ is around 1 nm. Practically, the minimal thickness of the silicon oxide layers and the silicon nitride layers may be limited by manufacturing processes. However, with procedures such as ALD (Atomic Layer Deposition), very small thicknesses can be obtained.

In the following, referring to FIG. 11, an OUM cell 1100 with single silicon oxide/silicon nitride bi-layer stacks according to an exemplary embodiment of the invention will be explained.

Again, a front end transistor 128 is shown which is connected, via a first via 906, to the phase change material 114. A second via 1104 is provided to provide contact with an upper metallization structure 120. For the embodiment of FIG. 11, the following constraints shall be considered:

$$t_{bottom\ nitride} + t_{bottom\ oxide} + t_{PCM} + t_{top\ oxide} + t_{nitride} > 4 L_{heat}$$

both $t_{bottom\ oxide}$ and $t_{top\ oxide}$ < both $t_{bottom\ nitride}$ and $t_{top\ nitride}$.

FIG. 12 shows an OUM cell 1200 according to an exemplary embodiment of the invention, having multiple further silicon oxide/silicon nitride bi-layer stacks. The following constraints shall be considered for the embodiment of FIG. 12:

$$N \times (t_{nitride} + t_{oxide}) > 4 L_{heat}\ t_{oxide} < t_{nitride}$$

The multiplication number N (N=14 in FIG. 12) can become very large for very thin silicon oxide layers and for very thin silicon nitride layers, for instance when $t_{oxide}$ and $t_{nitride}$ is around 1 nm.

Figure 13:
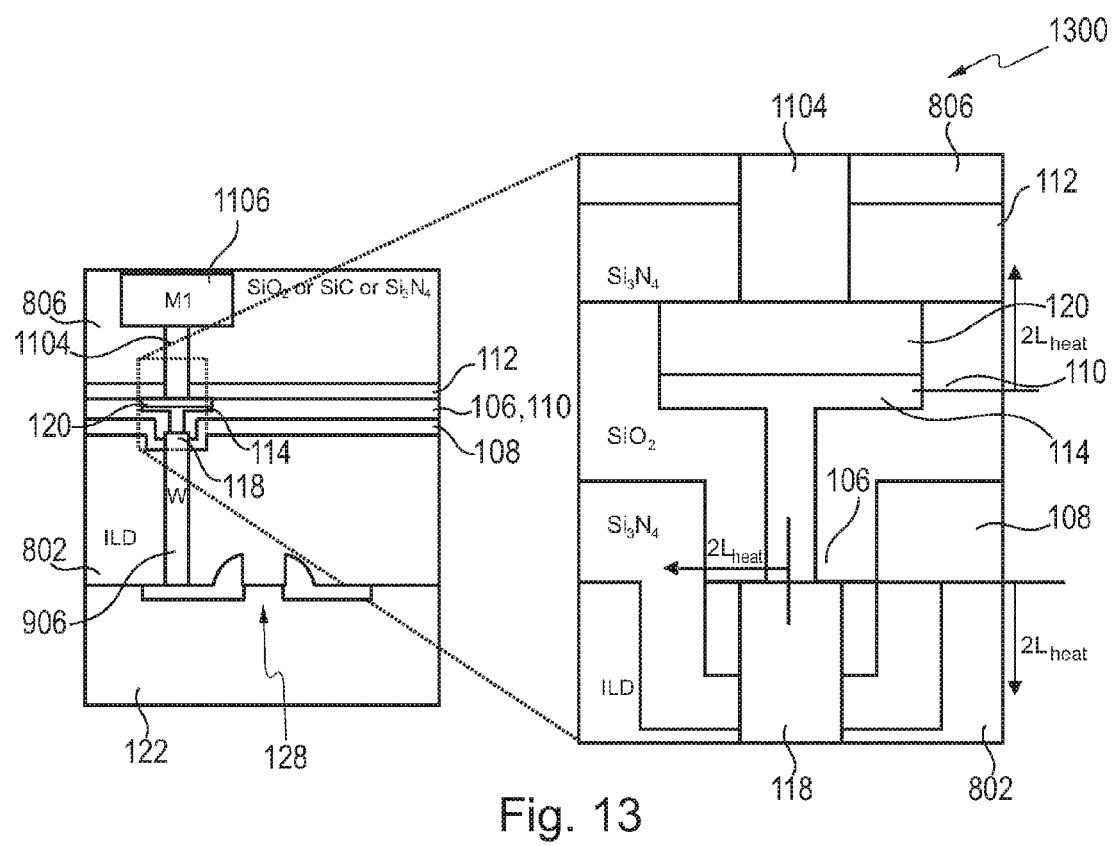
FIG. 13 shows an overview and a detailed cross-section of an electronic component according to an exemplary embodiment of the invention.

FIG. 13 shows a phase change material memory cell 1300 according to another exemplary embodiment of the invention.

FIG. 13 shows an OUM trench cell with single silicon oxide/silicon nitride bi-layer stacks. Alternatively, with a similar construction as in FIG. 13 implementing multiple silicon oxide/silicon nitride bi-layer stacks as shown in FIG. 12, an OUM trench cell according to a further embodiment may be manufactured.

Figure 14:
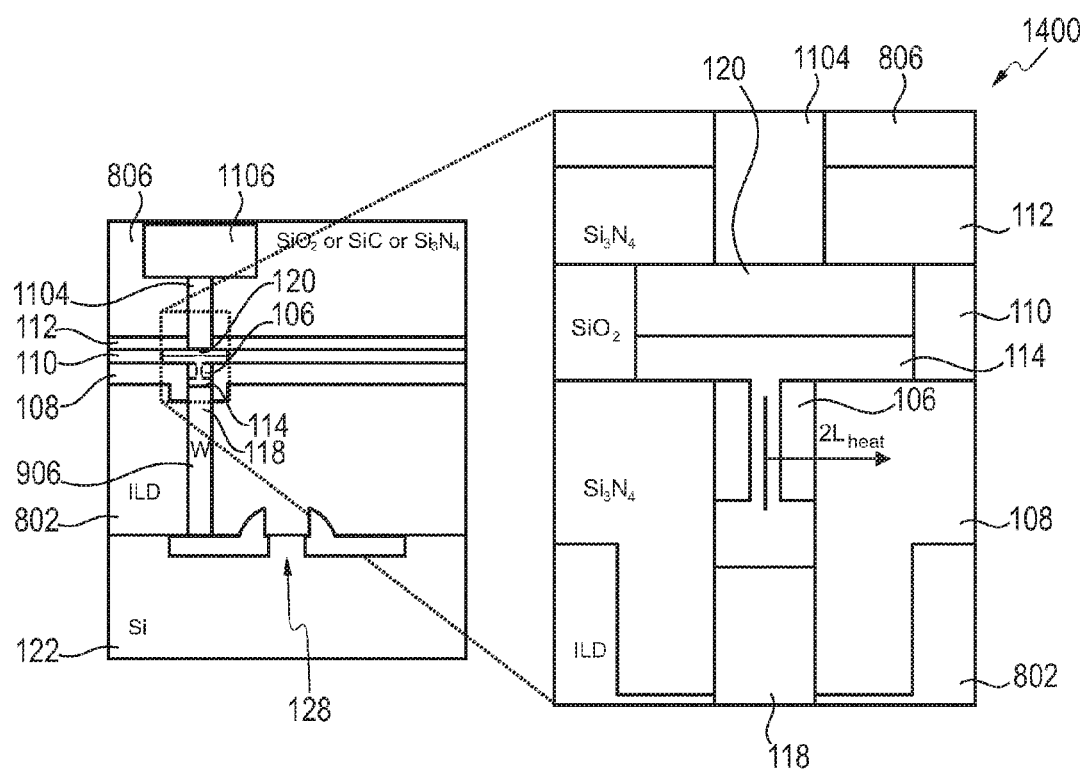
FIG. 14 shows an overview and a detailed cross-section of an electronic component according to an exemplary embodiment of the invention.

FIG. 14 shows a layer sequence 1400 illustrating another exemplary embodiment of the invention, related to a vertical PCRAM cell with single silicon oxide/silicon nitride bi-layer stacks. Alternatively, with a similar construction as in FIG. 14 implementing multiple silicon oxide/silicon nitride bi-layer stacks as shown in FIG. 12, a vertical PCRAM line cell according to a further embodiment may be manufactured.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic component, the electronic component comprising
   a first bi-layer stack comprising a first silicon oxide layer and a first silicon nitride layer;
   a second bi-layer stack comprising a second silicon oxide layer and a second silicon nitride layer;
   a convertible structure which is convertible between at least two states having different electrical properties, wherein the convertible structure is arranged at least partially between the first bi-layer stack and the second bi-layer stack; and
   at least one further bi-layer stack each comprising a further silicon oxide layer and a further silicon nitride layer, wherein at least one of the group consisting of the first bi-layer stack and the second bi-layer stack is arranged between the convertible structure and at least one of the at least one further bi-layer stack.

2. The electronic component according to claim 1, wherein the convertible structure is at least partially contacted to the first silicon oxide layer.

3. The electronic component according to claim 2, wherein the convertible structure is at least partially contacted to the second silicon oxide layer.

4. The electronic component according to claim 1, wherein the convertible structure is at least partially contacted to the second silicon oxide layer.

5. The electronic component according to claim 1, wherein at least one of the group consisting of the first silicon oxide layer, the first silicon nitride layer, the second silicon oxide layer, and the second silicon nitride layer is made by Plasma-Enhanced Chemical Vapor Deposition.

6. The electronic component according to claim 1, wherein at least one of the group consisting of the first silicon nitride layer and the second silicon nitride layer has a thickness between 20 nm and 100 nm.

7. The electronic component according to claim 1, wherein at least one of the group consisting of the first silicon oxide layer and the second silicon oxide layer has a thickness between 10 nm and 50 nm.

8. The electronic component according to claim 1, wherein the first silicon oxide layer and the second silicon oxide layer are integrally formed as a common layer.

9. The electronic component according to claim 1, wherein the convertible structure forms a thermo-dependent structure, particularly a phase change structure which is convertible between at least two phase states.

10. The electronic component according to claim 1, wherein the convertible structure is electrically conductive in at least one of the at least two states.

11. The electronic component according to claim 1, wherein the different electrical properties are at least one of the group consisting of different values of the electrical conductivity, different values of the permittivity, different values of the magnetic permeability, different values of the capacitance, and different values of the inductance of the convertible structure.

12. The electronic component according to claim 1, further comprising an electric driving and sensing circuitry adapted for driving and sensing the different electrical properties of the convertible structure in different ones of the at least two states.

13. The electronic component according to claim 1, wherein the convertible structure is adapted such that one of the at least two states relates to a crystalline phase and another one of the at least two states relates to an amorphous phase of the convertible structure.

14. The electronic component according to claim 1, further comprising a first electrode and a second electrode, the convertible structure being connected between the first electrode and the second electrode.

15. The electronic component according to claim 14, wherein an arrangement of the first electrode, the convertible structure, and the second electrode is aligned essentially perpendicular or essentially parallel to an arrangement of the first bi-layer stack, the convertible structure, and the second bi-layer stack.

16. The electronic component according to claim 1, wherein the electronic component is adapted as one of the group consisting of a memory device, a memory array, a gain controller, an actuator, a microelectromechanical structure, a controller, and a switch.

17. A method of forming an electronic component, the method comprising
- forming a first bi-layer stack comprising a first silicon oxide layer and a first silicon nitride layer;
- forming a second bi-layer stack comprising a second silicon oxide layer and a second silicon nitride layer;
- arranging a convertible structure, which is convertible between at least two states having different electrical properties, at least partially between the first bi-layer stack and the second bi-layer stack; and
- forming at least one further bi-layer stack each comprising a further silicon oxide layer and a further silicon nitride layer, wherein at least one of the group consisting of the first bi-layer stack and the second bi-layer stack is arranged between the convertible structure and at least one of the at least one further bi-layer stack.

* * * * *